(12) United States Patent
Ooka

(10) Patent No.: US 7,718,524 B2
(45) Date of Patent: May 18, 2010

(54) METHOD OF MANUFACTURING SEMICONDUCTOR DEVICE

(75) Inventor: Yutaka Ooka, Kanagawa (JP)

(73) Assignee: Sony Corporation, Tokyo (JP)

( * ) Notice: Subject to any disclaimer, the term of this patent is extended or adjusted under 35 U.S.C. 154(b) by 64 days.

(21) Appl. No.: 11/530,710

(22) Filed: Sep. 11, 2006

(65) Prior Publication Data

US 2007/0059919 A1 Mar. 15, 2007

(30) Foreign Application Priority Data

Sep. 14, 2005 (JP) ............................. 2005-266865

(51) Int. Cl.
*H01L 21/4763* (2006.01)
(52) U.S. Cl. ................. 438/622; 438/618; 257/E23.141
(58) Field of Classification Search ................. 438/618, 438/622
See application file for complete search history.

(56) References Cited

U.S. PATENT DOCUMENTS

| | | | |
|---|---|---|---|
| 5,374,835 A | * | 12/1994 | Shimada et al. ............. 257/284 |
| 6,069,068 A | * | 5/2000 | Rathore et al. ............... 438/628 |
| 7,153,774 B2 | * | 12/2006 | Hau-Riege et al. ........... 438/687 |
| 2006/0286805 A1 | * | 12/2006 | Hsu ............................ 438/689 |

FOREIGN PATENT DOCUMENTS

| | | | |
|---|---|---|---|
| JP | 11-045887 | | 2/1999 |
| JP | 11/045887 | * | 2/1999 |

OTHER PUBLICATIONS

T. Usui et al; Low Resistive and Highly Reliable Cu Dual-Dmascene Interconnect Technology Using Self-Formed MnSixOy Barrier Layer; Proceedings of IEEE IITC, 2005.

* cited by examiner

*Primary Examiner*—Thanhha Pham
*Assistant Examiner*—Tony Tran
(74) *Attorney, Agent, or Firm*—Sonnenschein Nath & Rosenthal LLP

(57) ABSTRACT

Disclosed herein is a method of manufacturing a semiconductor device, including the steps of: forming an interlayer insulating film on a semiconductor substrate; forming a metal mask on the interlayer insulating film; forming a pattern trench in the metal mask and the interlayer insulating film by etching away parts of the metal mask and the interlayer insulating film; forming a conductive layer on the interlayer insulating film so as to fill in the pattern trench; and polishing the excessive conductive layer and the metal mask on the interlayer insulating film so as to leave the conductive layer in the pattern trench.

1 Claim, 12 Drawing Sheets

METHOD OF MANUFACTURING SEMICONDUCTOR DEVICE

CROSS REFERENCES TO RELATED APPLICATIONS

The present invention contains subject matter related to Japanese Patent Application JP 2005-266865 filed in the Japanese Patent Office on Sep. 14, 2005, the entire contents of which being incorporated herein by reference.

BACKGROUND OF THE INVENTION

1. Field of the Invention

The present invention relates to a method of manufacturing a semiconductor device, and more particularly to a method of manufacturing a semiconductor device in which a single damascene process or a dual damascene process is adopted.

2. Description of the Related Art

A copper (Cu) wiring gives a semiconductor device a lower resistance, a smaller capacity and higher reliability than an aluminum (Al) alloy wiring line gives. Thus, the importance of the copper wiring has increased in a micro-element in which circuit delay due to a parasitic resistance and a parasitic capacity of a wiring are dominant. In general, since unlike the Al alloy wiring, it is not easy to etch away Cu by utilizing a dry etching method, a single damascene process is generally accepted for Cu. The single damascene process is a process for a wiring. In this process, a predetermined trench is previously formed in an interlayer insulating film formed of, for example, a silicon oxide ($SiO_2$) film, a wiring material is filled in the predetermined trench, and thereafter the excessive wiring material is removed by utilizing a chemical mechanical polishing (CMP) method or the like, thereby forming the desired wiring. Moreover, a dual damascene method in which after a contact hole and a wiring trench are formed, a wiring material is collectively filled in the contact hole and the wiring trench, and the excessive wiring material is then removed is also effective in reduction in the number of processes and the cost. This technique, for example, is disclosed in Japanese Patent Laid-open No. Hei 11-45887.

As a design rule for LSI has proceeded to scale down, a rate containing a barrier metal used to prevent scattering in a surface of a Cu wiring and grain boundaries or diffusion of Cu into an insulating film has increased. As a result, it is a problem that an abrupt increase in wiring resistance is generated due to an influence of such an increase or the like, which causes reduction in a processing speed of a semiconductor device. Moreover, the barrier metal is deposited in overhang-like shape in an upper end of the trench or the contact hole by utilizing a PVD method. As a result, there is also encountered such a problem that as the LSI design rule has proceeded to scale down, it is easy to generate a void when a wiring material (Cu in a normal case) is deposited.

As for the means for solving the above-mentioned problems, a method of thinning a barrier metal, or a method of forming a barrierless structure without using any of the barrier metals is well known. With regard to the thinning of the barrier metal, there is known a method of simply thinning the barrier metal deposited by utilizing the PVD method which is generally used. In addition thereto, recently, the barrier metal which is deposited by utilizing an atomic layer deposition (ALD) method has come to attract attention. In addition, with regard to the barrierless structure, in addition to a method of using a film which has a low diffusion coefficient of Cu and which is made of, for example, benzocychrobutene (BCB) as an insulating film, a method is known in which Cu is mixed with a metal such as magnesium (Mg) or aluminum (Al), whereby the barrier property is enhanced while an increase in wiring resistance is suppressed. This method is disclosed for example in T. Usui et al., "Low Resistive and Highly Reliable Cu Dual-Damascene Interconnect Technology Using Self-Formed $MnSi_xO_y$ Barrier Layer", Proceeding of IEEE IITC, 2005.

The barrierless structure or the thinning of the barrier metal makes it possible to reduce the wiring resistance of the semiconductor device. However, the following problems are caused in the CMP process when the wiring is formed. Hereinafter, these problems will be described by giving the barrierless structure as an example.

FIG. 4A is a process cross sectional view before the CMP is performed in the single damascene process or the dual damascene process. As shown in FIG. 4A, a wiring trench is formed in an interlayer insulating film 102 on a base substrate 101, and a conductive layer 104 made of Cu or the like is formed over the interlayer insulating film 102 so as to fill in the wiring trench. Normally, a swelling amount of conductive layer 104 in a region having a high wiring density becomes high, while a swelling amount of conductive layer 104 in a region having a low wiring density becomes low.

After that, the conductive layer 104 is subjected to the CMP in order to remove the excessive conductive layer 104 on the interlayer insulating film 102. The CMP includes a first step of flattening the conductive layer 104 by removing the excessive conductive layer 104 made of Cu, and a second step of removing surfaces of the conductive layer 104 and the interlayer insulating film 102 while the flattening of the conductive layer 104 is maintained. In the second step, in general, in order to remove a facet of the wiring which is generated during the processing, a slurry for substantially equalizing the polishing rates of the conductive layer 104 and the interlayer insulating film 102 to each other is used, and the polishing is performed until a desired wiring height is obtained while the flattening is maintained.

SUMMARY OF THE INVENTION

However, non-use of the barrier metal results in that there is no polishing stopper. As a result, the flat conductive layer 104 may not be obtained after completion of the polishing in the first step. Thus, an erosion is generated in which in the region having a low pattern density, the interlayer insulating film 102 and the conductive layer 104 are excessively polished (refer to FIG. 4B). Even when the polishing in the second step is performed in this state, the surfaces of the conductive layer 104 and the interlayer insulating film 102 are removed with the erosion left unimproved (refer to FIG. 4C).

It is also thought that in order to suppress the erosion, a slurry having a higher polishing selectivity of the conductive layer 104 to the interlayer insulating film 102 is used in the first step. FIGS. 12A to 12C show respectively process cross sectional views in this case.

When the slurry having the higher polishing selectivity of the conductive layer 104 to the interlayer insulating film 102 is used in the first step, a dishing in which the surface of the conductive layer 104 is lowered with respect to the surface of the interlayer insulating film 102 is generated in the region having a low pattern density (refer to FIG. 5B). Even when the polishing in the second step is performed in this state, the surfaces of the conductive layer 104 and the interlayer insulating film 102 are removed with the dishing left unimproved (refer to FIG. 5C).

Actually, the erosion and the dishing are simultaneously generated within a surface of a wafer. In any case, when the barrierless structure is adopted, it becomes difficult to form the wiring having high flatness since there is no polishing stopper. The above-mentioned problem is similarly caused even when the barrier metal is thinned. The reason for this is that the thinned barrier metal does not function as the polishing stopper.

The present invention has been made in the light of the above-mentioned circumstances, and it is therefore desirable to provide a method of manufacturing a semiconductor device which is capable of improving flatness of a wiring even when there is no barrier metal.

According to an aspect of the present invention, there is provided a method of manufacturing a semiconductor device, including the steps of: forming an interlayer insulating film on a semiconductor substrate; forming a metal mask on the interlayer insulating film; forming a pattern trench in the metal mask and the interlayer insulating film by etching away parts of the metal mask and the interlayer insulating film; forming a conductive layer on the interlayer insulating film so as to fill in the pattern trench; and polishing the excessive conductive layer and the metal mask on the interlayer insulating film so as to leave the conductive layer in the pattern trench.

In the aspect of the present invention described above, when the pattern trench is formed in the metal mask and the interlayer insulating film, the metal mask is left in a portion other than the pattern trench in the interlayer insulating film. That is to say, the metal mask is left only on a surface to be polished, which will be polished later, of the surface of the interlayer insulating film.

For this reason, even when the conductive layer is directly filled in the pattern trench of the interlayer insulating film, and the conductive layer on the interlayer insulating film other than the pattern trench is then polished, the metal mask concerned functions as the polishing stopper. As a result, the wiring containing therein no barrier metal is formed.

According to the present invention, it is possible to manufacture the semiconductor device in which the flatness of the barrierless structure and the wiring is improved. As a result, it is possible to realize the lowering of the wiring resistance, and thus it is possible to manufacture the semiconductor device having a high processing speed.

The above and other features and advantages of the present invention will become apparent from the following description when taken in conjunction with the accompanying drawings which illustrate preferred embodiments of the present invention by way of example.

DETAILED DESCRIPTION OF THE PREFERRED EMBODIMENTS

Preferred embodiments of the present invention will be described hereinafter in detail with reference to the accompanying drawings.

Embodiment 1

Embodiment 1 of the present invention will now be described in detail with reference to FIGS. 1A to 1E. In Embodiment 1 of the present invention, an example in which the present invention is applied to a single damascene process will be described below.

Figure 1A:
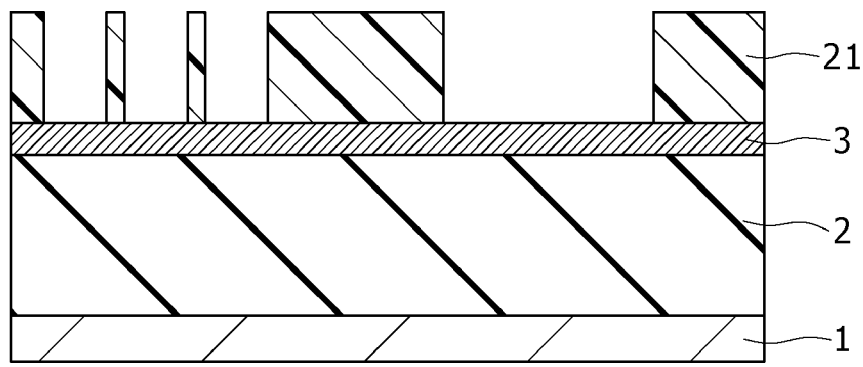
FIGS. 1A to 1E are respectively process cross sectional views explaining a method of manufacturing a semiconductor device according to Embodiment 1 of the present invention.

As shown in FIG. 1A, for example, a silicon carbide oxide film (SiOC) is deposited to be 150 nm thick on a base substrate 1 to form a first interlayer insulating film 2. The base substrate 1 is such that a transistor and other constituent elements are formed on a semiconductor substrate made of silicon or the like, and thus corresponds to a semiconductor substrate of the present invention. Subsequently, for example, a tantalum (Ta) film is deposited to be 10 nm thick for example on the first interlayer insulating film 2 to form a metal mask 3 made of a metal material. In this case, the silicon carbide oxide film is formed by using a parallel plate plasma enhanced CVD system for example. In formation of the silicon carbide oxide film, methylsilane ($SiCH_3$) is used as a gas for a silicon source. In addition, the tantalum film is deposited by utilizing a directional sputtering method using a general magnetron sputtering system and a tantalum target for example. A thickness of the metal mask 3 in Embodiment 1 is desirably set to 5 nm or more from the purpose of stopping the polishing when the conductive layer (made of Cu) is subjected to the CMP. In addition, the thickness of the metal mask 3 is preferably set to a given thickness or less allowing the light to penetrate through the metal mask 3 from the purpose of making alignment with a lower layer during a lithography process for formation of a wiring. Although depending on the material of the metal mask 3, this recommended thickness is desirably set to 15 nm or less. Subsequently, a resist mask 21 having a wiring pattern is formed on the metal mask 3 by utilizing the lithography technique.

Figure 1B:
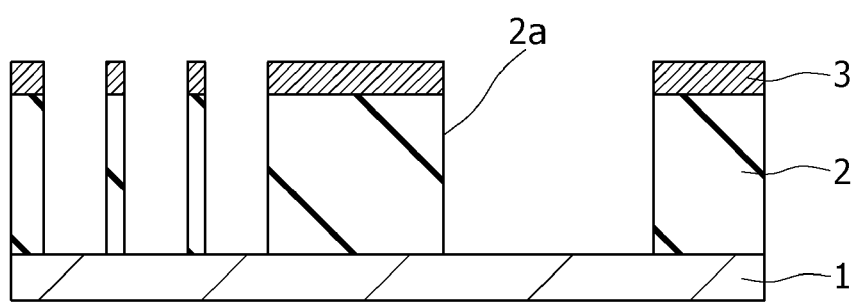

As shown in FIG. 1B, the metal mask (formed of the tantalum film) 3 is selectively etched away by utilizing a dry etching method using the resist mask 21 having the wiring pattern. Subsequently, after the first interlayer insulating film 2 is selectively etched away by utilizing the dry etching method, the resist mask 21 and the residual deposited material during the etching treatment are removed through an ashing using oxygen ($O_2$) plasma and an after-treatment using a chemical. As a result, a wiring trench 2a is formed in the first interlayer insulating film 2 and the metal mask 3. The processing for the metal mask 3 in Embodiment 1 can be performed by using the general magnetron etching system under a condition in which a halogen gas is used as an etching gas. In this case, the processing for the metal mask 3 is performed under the condition in which a chlorine ($Cl_2$) gas is used as the etching gas and a bias power is set to 800 W. In addition, the processing for the silicon carbide oxide film as the first interlayer insulating film 2 is performed by using the general magnetron etching system under the condition in which an octafluorobutane ($C_4F_8$) gas and an argon (Ar) gas are used as the etching gas, and the bias power is set to 400 W. Also, a gas flow ratio ($C_4F_8$:Ar) is set to 1:4, and a substrate temperature is set to 20° C.

Figure 1C:
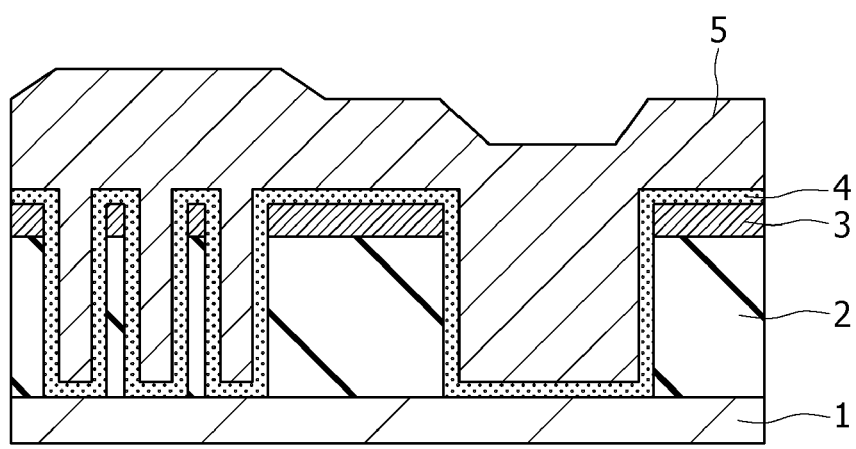

As shown in FIG. 1C, after a degassing treatment is performed, an alloy containing therein Cu is deposited by utilizing a sputtering method to form a seed layer 4 on which a wiring material (Cu) is deposited by utilizing an electrolytic plating method. For the deposition of the seed layer 4 in Embodiment 1, in order to form the seed layer 4 on the wiring trench 2a with high coverage, it is preferably recommended to utilize a directional sputtering method such as a self-discharge ionization sputtering method or a long distance sputtering method. In Embodiment 1, a CuMn alloy is deposited as the seed layer 4 to be 40 nm thick by utilizing the directional sputtering method using a CuMn target containing therein 5% manganese (Mn).

Subsequently, after a conductive layer 5 made of Cu is deposited by utilizing the electrolytic plating method, the sputtering method or the CVD method, an annealing treatment is performed for the conductive layer 5 at 300° C. for 15 minutes. At that, in Embodiment 1, the electrolytic plating method is used for deposition of the conductive layer 5. In this annealing process, manganese (Mn) in the seed layer 4 existing near the first interlayer film 2 is bonded to silicon containing in the first interlayer insulating film 2, whereby an $MnSi_xO_y$ barrier layer (alloy layer) having a high barrier property against Cu is formed in a self-aligned manner. As a result, it is possible to form a high performance Cu wiring even if any of the barrier metals such as tantalum which have been used in related art is not used. In addition, this barrier layer also has a merit that the resistance of the Cu wiring is hardly made to increase because it is contained in the Cu seed layer 4 by about several percentages.

Figure 1D:
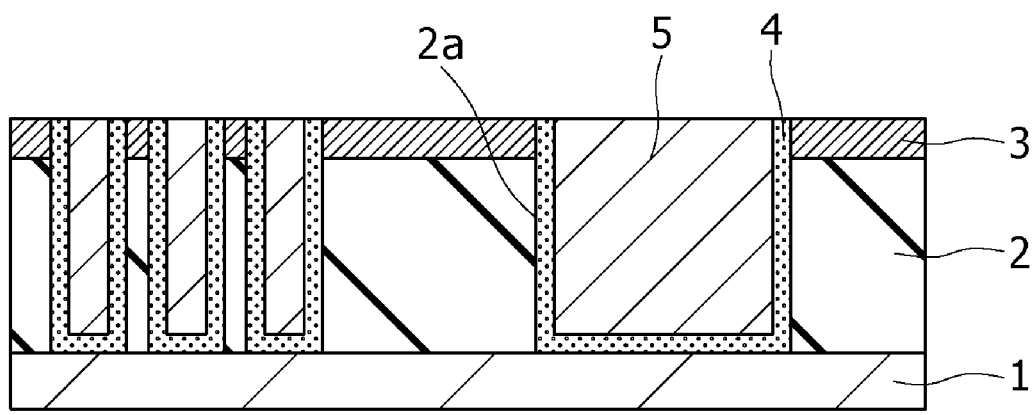

As shown in FIG. 1D, the excessive conductive layer (made of Cu) 5 other than the conductive layer 5 filled in the wiring trench 2a is removed by utilizing the CMP method for example. In a first step of the CMP method, the excessive conductive layer (made of Cu) is polished by using a silica slurry providing a large selectivity of the excessive conductive layer 5 to each of the metal mask 3 and the first interlayer insulating film (silicon carbide oxide film) 2. In general, in the conductive layer 5, the swelling amount of pattern is high as the pattern is denser, while the swelling amount of pattern is low as the pattern is sparser (refer to FIG. 1C). However, in the single damascene structure formed in accordance with Embodiment 1, the metal mask 3 made of the metal material is deposited as the uppermost layer to be 10 nm thick. As a result, even in the case of the structure having no barrier metal in the Cu wiring, the polishing can be stopped on the metal mask 3, which makes it possible to form the wiring which is excellent in flatness.

Figure 1E:
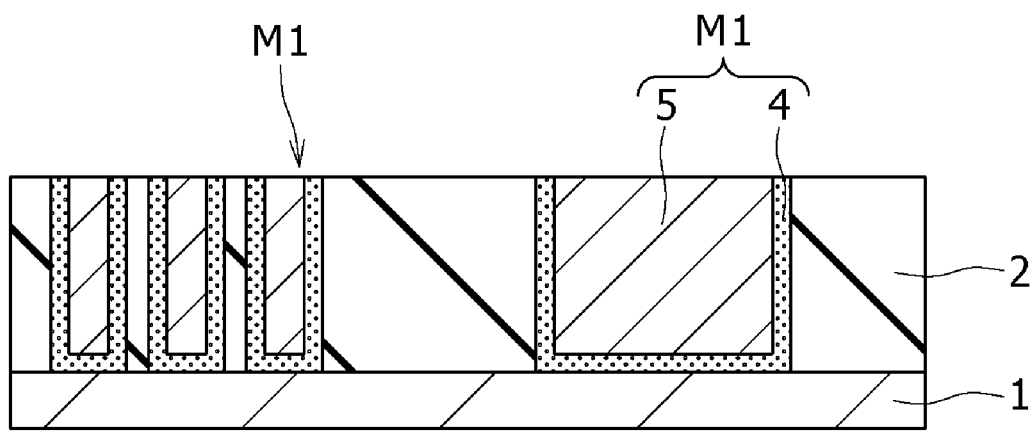

As shown in FIG. 1E, in a second step of the CMP method, the excessive metal mask 3 left on the first interlayer insulating film 2 is polished by using a silica slurry for equalizing the polishing rates of the metal mask 3, the first interlayer insulating film (silicon carbide oxide film) 2, and the conductive layer (made of Cu) 5 to one another. Here, although the polishing is excessively performed in order to suppress the polishing residue of the metal mask 3 (over-polishing), since the silica slurry is used to equalize polishing rates of the metal mask 3, the first interlayer insulating film (silicon carbide oxide film) 2, and the conductive layer (made of Cu) 5 to one another, the polishing progresses while the flatness obtained in the first step of the CMP method is maintained. As a result, it becomes possible to form a first level wiring M1 which is free from the polishing residue of the metal mask 3, and thus which is excellent in flatness. At that, an amount of excessive metal mask 3 over-polished in Embodiment 1 is adjusted so that a final height of the first level wiring M1 becomes 130 nm.

In formation of the single damascene structure of Embodiment 1, the thick metal mask 3 with 10 nm thickness can be left on the first interlayer insulating film 2 other than the wiring trench 2a. Hence, during the CMP process, the polishing can be stopped on the metal mask 3 while the excellent flatness is maintained. Thus, it is possible to suppress the getting worse of the flatness of the wiring. As a result, even when the LSI design rule proceeds to scale down, it is possible to provide the semiconductor device which has the low resistance, i.e., the high processing speed. The semiconductor device manufactured in accordance with Embodiment 1 of the present invention has at least the lower resistance, higher processing speed and less dispersion (more excellent flatness) characteristics than any of the semiconductor device in related art has.

Embodiment 2

The example in which the present invention is applied to the single damascene process has been described so far in Embodiment 1, whereas an example in which the present invention is applied to a dual damascene process will be described below in detail in Embodiment 2. It should be noted that the lower level wiring will now be described by using the wiring structure which, for example, is manufactured through the processes of Embodiment 1.

Figure 2A:
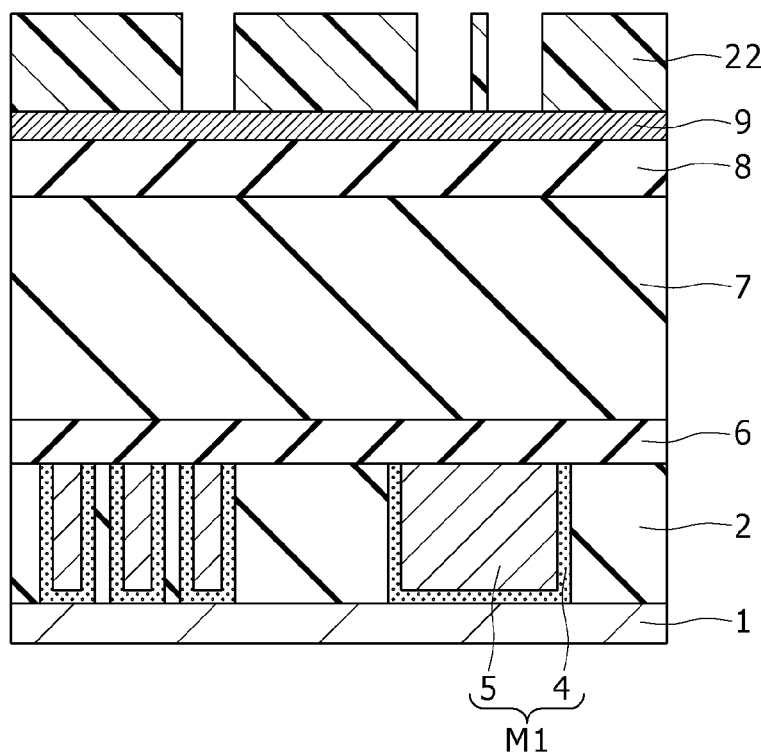
FIGS. 2A-2K are respectively process cross sectional views explaining a method of manufacturing a semiconductor device according to Embodiment 2 of the present invention.

As shown in FIG. 2A, after a predetermined after-treatment is performed, a silicon carbide (SiC) film is deposited on the first level wiring M1 to be 35 nm thick for example to form a diffusion preventing film 6 against Cu. The diffusion preventing film 6 thus formed functions as an oxidation preventing film as well for Cu. The silicon carbide film, for example, can be deposited by using the parallel plate plasma enhanced CVD system under the condition in which a pressure is set at 550 Pa and methylsilane ($SiCH_3$) is used as the gas for the silicon source. Subsequently, a silicon carbide oxide film (SiOC), for example, is deposited on the diffusion preventing film 6 to be 300 nm thick to form a second interlayer insulating film 7. Here, the silicon carbide oxide film, for example, is deposited by using the parallel plate plasma enhanced CVD system under the condition in which methylsilane ($SiCH_3$) is used as the gas for the silicon source. Subsequently, an insulating film 8 formed of a silicon oxide ($SiO_2$) film, for example, is formed on the second interlayer insulating film 7 to be about 100 nm thick. Subsequently, a tantalum (Ta) film, for example, is deposited on the insulating film 8 to be 10 nm thick to form a metal mask 9. Here, the silicon oxide film as the insulating film 8, for example, is formed by using the parallel plate plasma enhanced CVD system under the condition in which monosilane ($SiH_3$) is used as the gas for the silicon source. In addition, the tantalum film, for example, is deposited by utilizing the directional sputtering method using the general magnetron sputtering system and a tantalum target. A thickness of the tantalum film in Embodiment 1 is desirably set to 5 nm or more from the purpose of stopping the polishing when a conductive layer (made of Cu) is subjected to the CMP. In addition, for the purpose of making the alignment with the lower layer during the lithography process for formation of the wiring, the thickness of the metal mask 9 is preferably set to a given thickness allowing the light to penetrate through the metal mask 9. Although depending on the material of the metal mask 9, this thickness is desirably recommended to be set to 15 nm or less. Subsequently, a resist mask 22 having a contact hole pattern is formed on the metal mask 9 by utilizing the lithography technique.

Figure 2B:
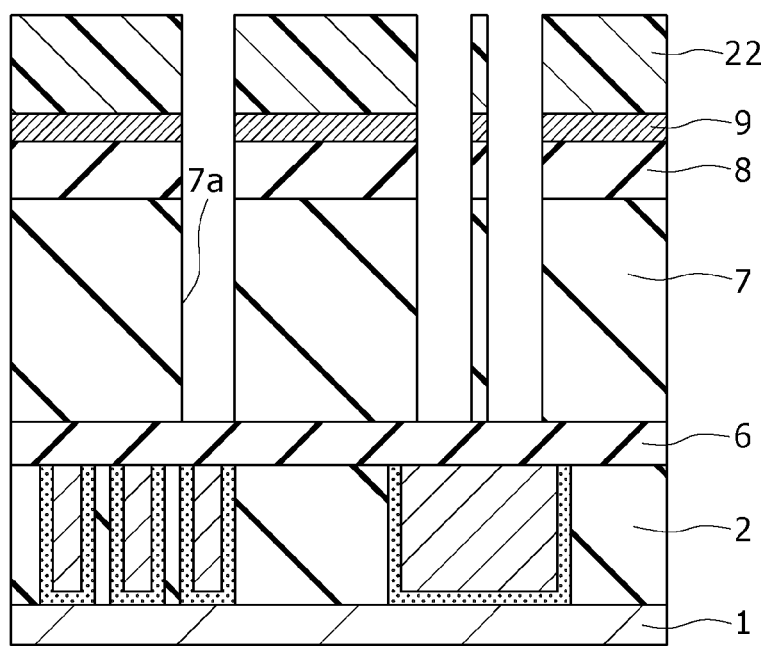

As shown in FIG. 2B, a contact hole 7a is formed in the metal mask (tantalum film) 9, the insulating film (silicon oxide film) 8, and the second interlayer insulating film (silicon carbide oxide film) by utilizing the dry etching method using the resist mask 22 having the contact hole pattern. The processing for the metal mask 9 in Embodiment 2 can be performed by using the general magnetron etching system under the condition in which the halogen gas is used as the etching gas. In this case, specifically, the processing for the metal mask 9 is performed under the condition in which the chlorine ($Cl_2$) gas is used as the etching gas and the bias power is set to 800 W. In addition, the processing for the second interlayer insulating film (silicon carbide oxide film) 7 and the insulating film (silicon oxide film) 8 is performed by using the general magnetron etching system under the condition in which an octafluorobutane ($C_4F_8$) gas, the argon (Ar) gas and an oxygen ($O_2$) gas are used as the etching gas, and the bias power is set to 500 W. Also, the gas flow ratio ($C_4F_8$:Ar:$O_2$) is set to 1:4:2 and the substrate temperature is set to 20° C. in order to equalize the processing rates of the silicon carbide oxide film and the silicon oxide film to each other.

Figure 2C:
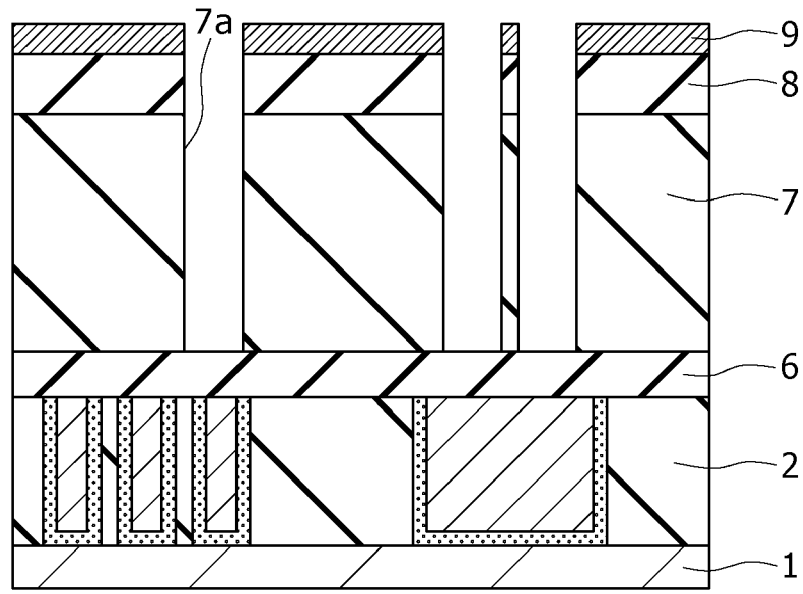

As shown in FIG. 2C, the resist mask 22 and the residual deposited material generated during the etching treatment are removed through the ashing using the oxygen ($O_2$) plasma and the after-treatment using the chemical.

Figure 2D:
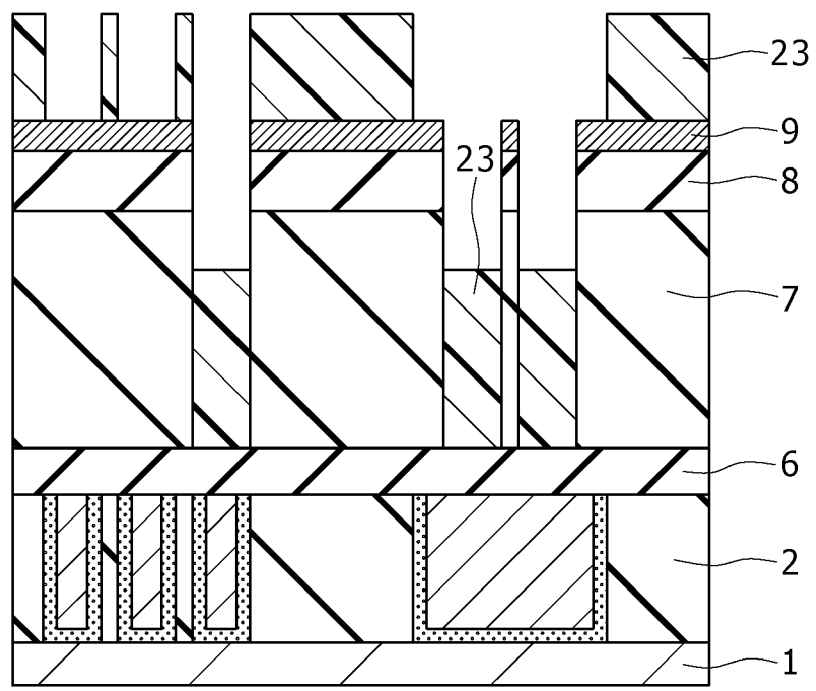

As shown in FIG. 2D, a resist mask 23 having a wiring pattern is formed on the metal mask 9 and an exposed portion of the diffusion preventing film 6 by utilizing the lithography technique.

Figure 2E:
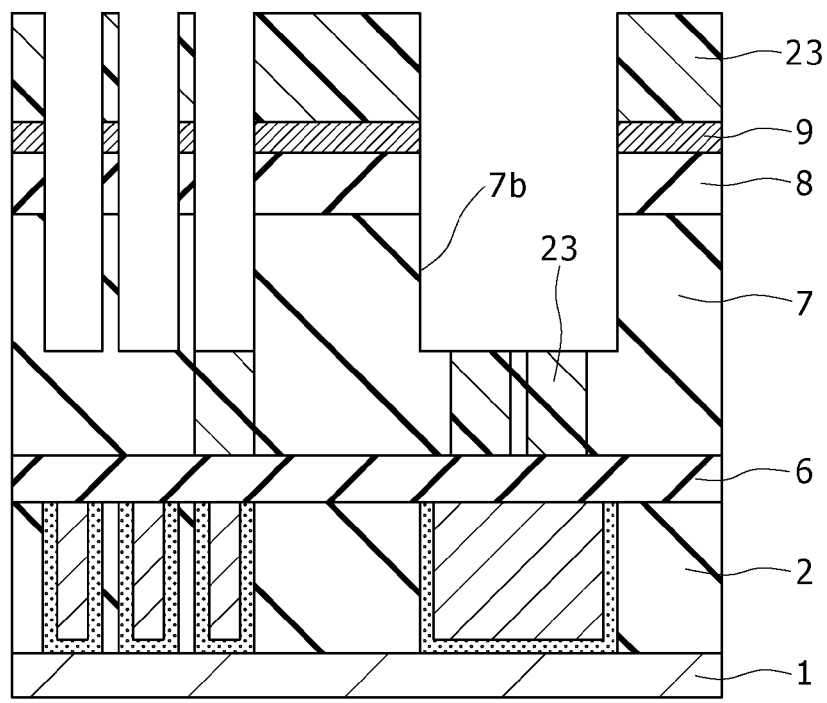

As shown in FIG. 2E, a wiring trench 7b is formed in the metal mask (tantalum film) 9, the insulating film (silicon oxide film) 8, and the second interlayer insulating film (silicon carbide oxide film) 7 by utilizing the dry etching method using the resist mask 23. Here, an amount of silicon carbide oxide film etched is set to 200 nm in depth so that a depth of the contact hole 7a becomes 135 nm. The processing for the metal mask 9 in Embodiment 2 can be performed by using the general magnetron etching system under the condition in which the halogen gas is used as the etching gas. In this case, specifically, the processing for the metal mask 9 is performed under the condition in which the chlorine ($Cl_2$) gas is used as the etching gas and the bias power is set to 800 W. In addition, the processing for the second interlayer insulating film (silicon carbide oxide film) 7 and the insulating film (silicon oxide film) 8 is performed by using the general magnetron etching system under the condition in which the octafluorobutane ($C_4F_8$) gas, the argon (Ar) gas and the oxygen ($O_2$) gas are used as the etching gas, and the bias power is set to 500 W. Also, the gas flow ratio ($C_4F_8$:Ar:$O_2$) is set to 1:4:2 and the substrate temperature is set to 20° C. in order to equalize the processing rates of the silicon carbide oxide film and the silicon oxide film to each other.

Figure 2F:
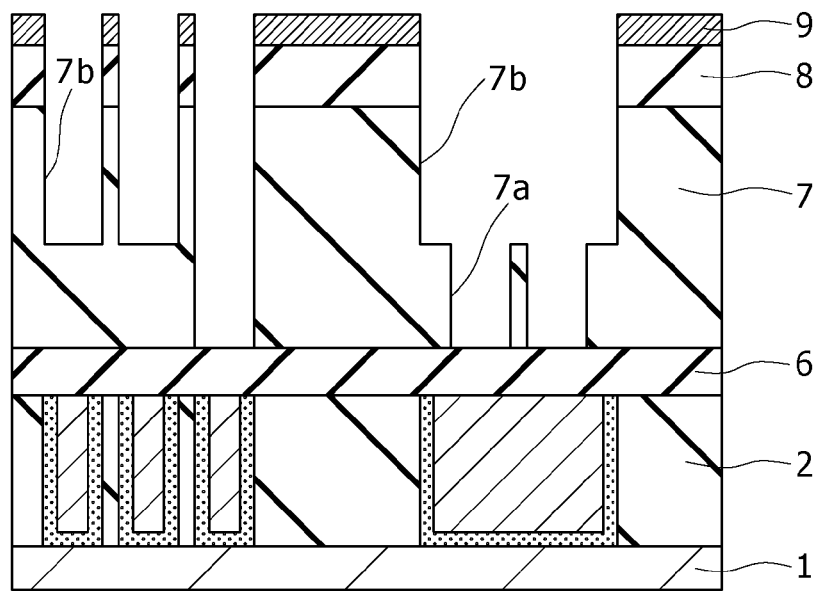

As shown in FIG. 2F, the resist mask 23 and the residual deposited material generated during the etching treatment are removed through the ashing using the oxygen ($O_2$) plasma and the after-treatment using the chemical.

Figure 2G:
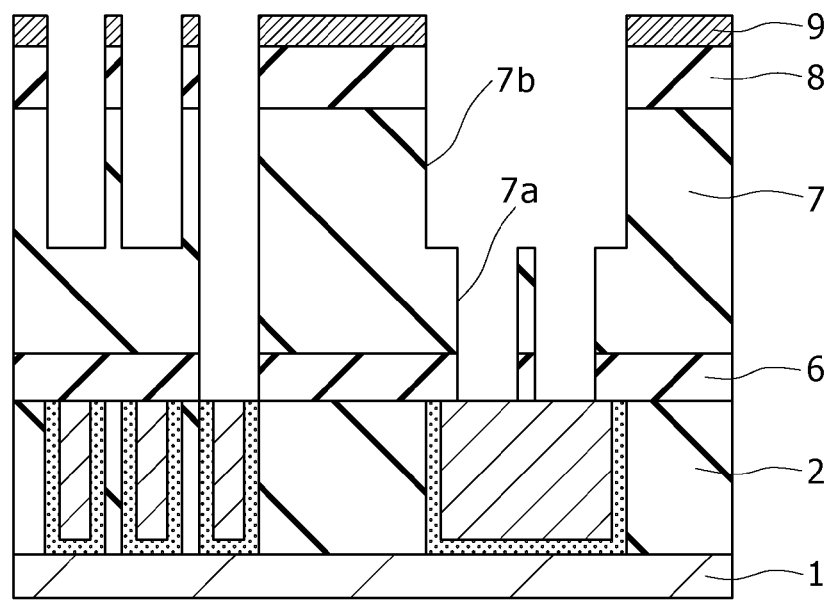

As shown in FIG. 2G, the diffusion preventing film (SiC film) 6 lying in a bottom portion of the contact hole 7a is etched away to form the contact hole 7a connected to the first level wiring M1, thereby completing the predetermined dual damascene processing. The etching in this case, for example, is performed by using the general magnetron etching system under the condition in which a difluoromethane ($CH_2F_2$) gas, the oxygen ($O_2$) gas and the argon (Ar) gas are used as the etching gas, the gas flow ratio ($CH_2F_2$:$O_2$:Ar) is set to 2:1:5, and the bias power is set to 100 W.

Figure 2H:
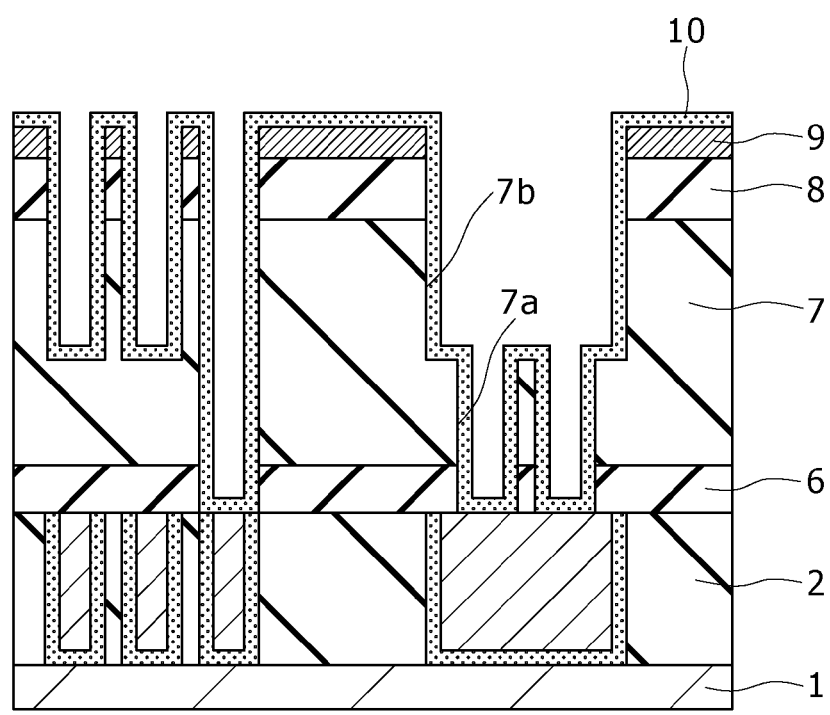

As shown in FIG. 2H, after the degassing treatment is performed, the alloy containing therein Cu is deposited by utilizing the sputtering method to form a seed layer 10 on which a wiring material (Cu) is deposited by utilizing the electrolytic plating method. For the purpose of forming the seed layer 10 on the contact hole 7a and the wiring trench 7b with the high coverage, it is preferably recommended to utilize the directional sputtering method such as the self-discharge ionization sputtering method or the long distance sputtering method. In Embodiment 2, specifically, the CuMn alloy is deposited to be 40 nm thick by utilizing the directional sputtering method using the CuMn target containing therein 5% manganese (Mn).

Figure 2I:
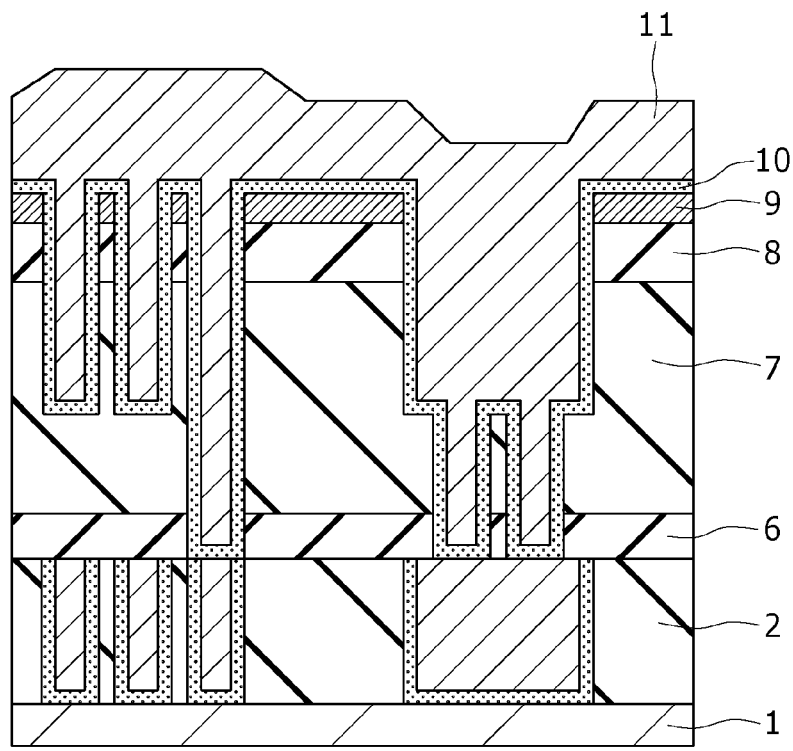

As shown in FIG. 2I, a conductive layer 11 made of Cu is deposited so as to fill in the contact hole 7a and the wiring trench 7b by utilizing the electrolytic plating method, the sputtering method or the CVD method. After that, the annealing treatment is performed for the conductive layer 11 at 300° C. for 15 minutes. At that, in Embodiment 2, the electrolytic plating method is used for deposition of the conductive layer 11. In this annealing process, manganese (Mn) in the seed layer 10 existing near the second interlayer insulating film 7 is bonded to silicon contained in the second interlayer insulating film 7, whereby the $MnSi_xO_y$ barrier layer (alloy layer) having the high barrier property against Cu is formed in the self-aligned manner. As a result, it is possible to form the high performance Cu wiring even if any of the barrier metals such as tantalum which have been used in related art is not used. In addition, this barrier layer also has a merit that the resistance of the Cu wiring is hardly made to increase because it is contained in the Cu seed layer by about several percentages.

Figure 2J:
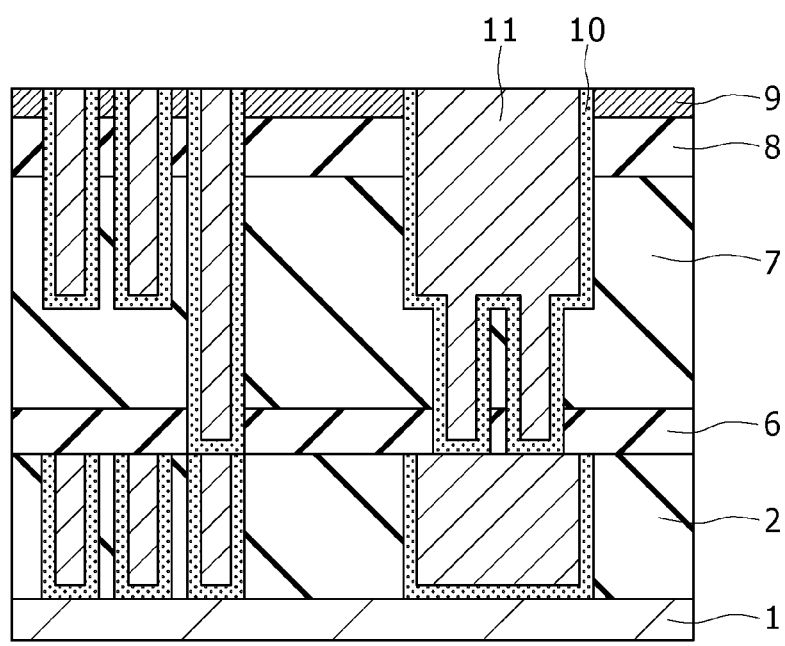

As shown in FIG. 2J, the excessive conductive layer (made of Cu) 11 other than the contact hole 7a and the wiring trench 7b is removed by utilizing the CMP method for example. In a first step of the CMP method, the excessive conductive layer (made of Cu) 11 is polished by using the silica slurry providing a large selectivity of the excessive conductive layer (made of Cu) 11 to each of the metal mask 9 and the second interlayer insulating film 7. In general, in the conductive layer 5, the swelling amount of pattern is high as the pattern is denser, while the swelling amount of pattern is low as the pattern is sparser (refer to FIG. 2I). However, in the dual damascene structure formed in accordance with Embodiment 2, the metal mask 9 made of the metal material is deposited as the uppermost layer to be 10 nm thick. As a result, even in the case of the structure having no barrier metal in the Cu wiring, the polishing can be stopped on the metal mask 9, which makes it possible to form the wiring which is excellent in flatness.

Figure 2K:
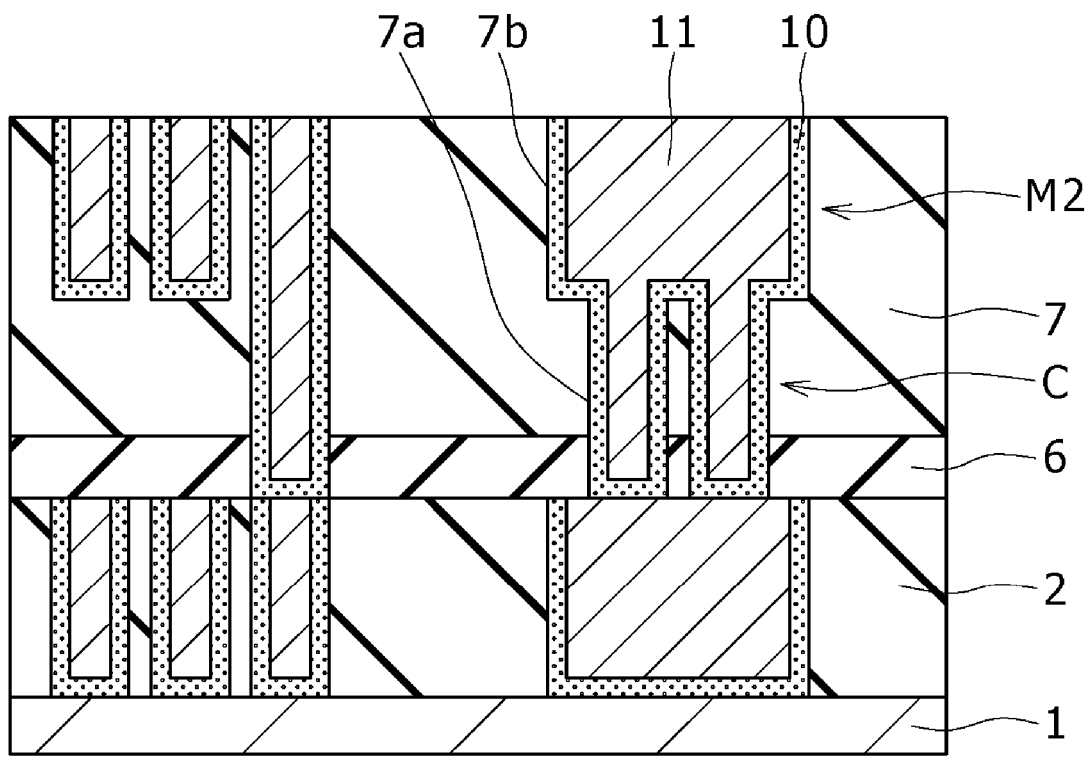

As shown in FIG. 2K, in a second step of the CMP method, the excessive metal mask 9 left on the second interlayer insulating film 7 is polished by using the silica slurry for equalizing the polishing rates of the metal mask 9, the insulating film (silicon oxide film) 8, the second interlayer insulating film (silicon carbide oxide film) 7, and the conductive layer (made of Cu) 11 to one another. The seed layer 10 and the conductive layer 11 within the wiring trench 7b become a second level wiring M2, and the seed layer 10 and the conductive layer 11 within the contact hole 7a become a contact C through which the second level wiring M2 is connected to the first level wiring M1. Here, although the polishing is excessively performed in order to suppress the polishing residue of the metal mask 9 (over-polishing), since the silica slurry is used to equalize polishing rates of the metal mask 9, the second interlayer insulating film (silicon carbide oxide film) 7, and the conductive layer (made of Cu) 11 to one another, the polishing progresses while the flatness obtained in the first step of the CMP method is maintained. As a result, it becomes possible to form the second level wiring M2 which is free from the polishing residue of the metal mask 9, and thus which is excellent in flatness. At that, the amount of excessive metal mask 9 over-polished in Embodiment 2 is adjusted so that a final height of the second level wiring M2 becomes 130 nm.

In formation of the dual damascene structure of Embodiment 2, the thick metal mask 9 with 10 nm thickness can be left on the second interlayer insulating film 7 other than the contact hole 7a and the wiring trench 7b. Hence, during the CMP process, the polishing can be stopped on the metal mask 9 while the excellent flatness is maintained. Thus, it is possible to suppress the getting worse of the flatness of the wiring. As a result, even when the LSI design rule proceeds to scale down, it is possible to provide the semiconductor device which has the low resistance, i.e., the high processing speed. The semiconductor device manufactured in accordance with Embodiment 2 of the present invention has at least the lower resistance, higher processing speed and less dispersion (more excellent flatness) characteristics than any of the semiconductor device in related art has.

Embodiment 3

The examples in which the present invention is applied to the single damascene structure and the dual damascene structure each having no barrier metal have been described so far in Embodiments 1 and 2, respectively. However, it is also possible to apply the present invention to the single damascene structure or the dual damascene structure each using a thin film barrier metal. An application example at this time will be described hereinafter. At that, since the processes in Embodiment 3 until the process shown in FIG. 2G are the same as those in Embodiment 2, their descriptions are omitted here for the sake of simplicity.

Figure 3A:
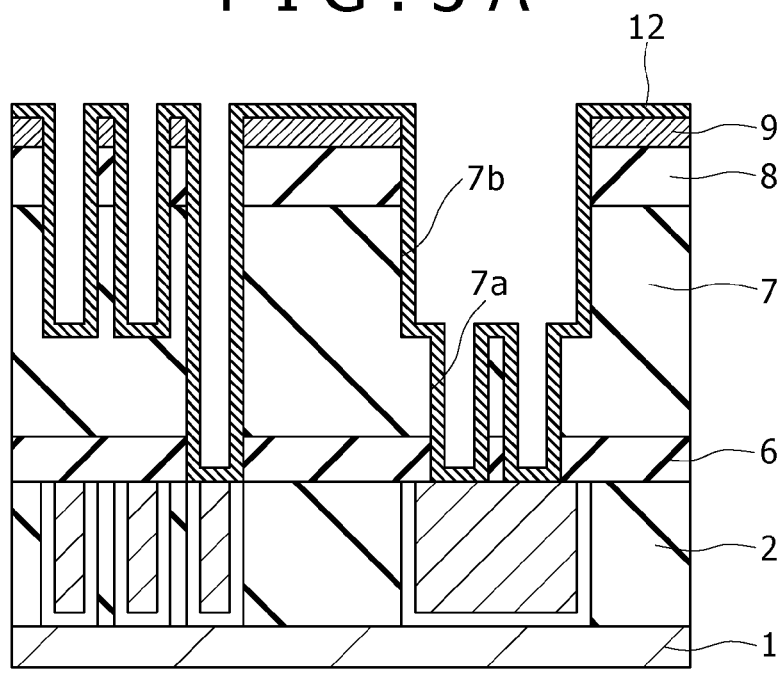
FIGS. 3A-3D are respectively process cross sectional views explaining a method of manufacturing a semiconductor device according to Embodiment 3 of the present invention.

As shown in FIG. 3A, after the degassing treatment is performed, a tantalum (Ta) film, for example, is deposited to be 3 nm thick to form a barrier metal 12 for preventing Cu from diffusing into the second interlayer insulating film 7. In this case, for example, the tantalum (Ta) film is deposited by utilizing the directional sputtering method using the general magnetron sputtering system and the Ta target. For the deposition of the barrier metal 12 in Embodiment 3, for the purpose of forming the barrier metal 12 on the contact hole 7a and the wiring trench 7b with the high coverage, it is preferably recommended to use the directional sputtering method such as the self-discharge ionization sputtering or the long distance sputtering method.

Figure 3B:
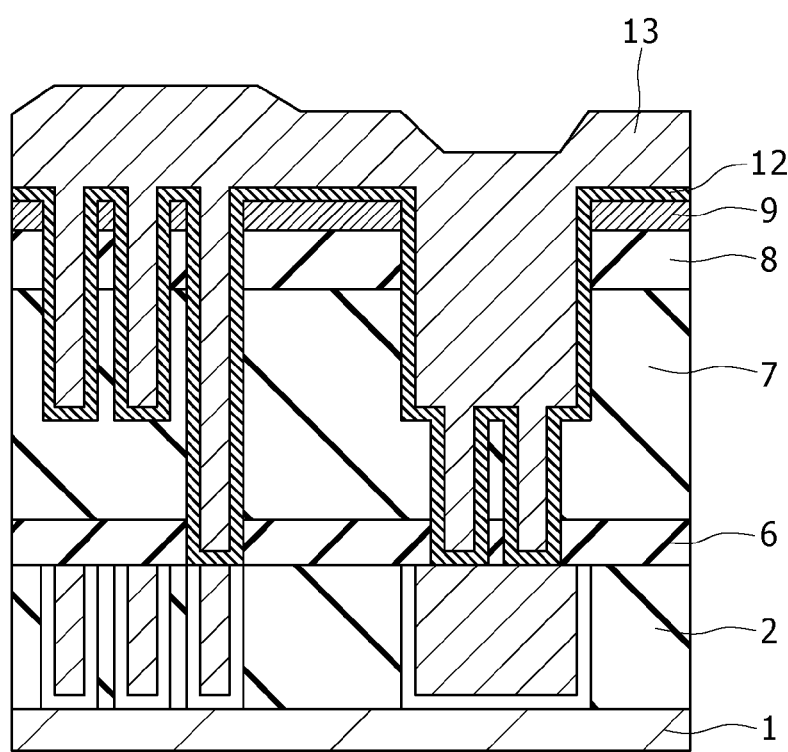

As shown in FIG. 3B, a film made of Cu or an alloy containing therein Cu is deposited by utilizing the electrolytic plating, the sputtering method or the CVD method to form a conductive layer 13 so as to fill in the contact hole 7a and the wiring trench 7b. In this process, after formation of the seed layer similar to that in each of Embodiments 1 and 2, the conductive layer 13 may be formed.

Figure 3C:
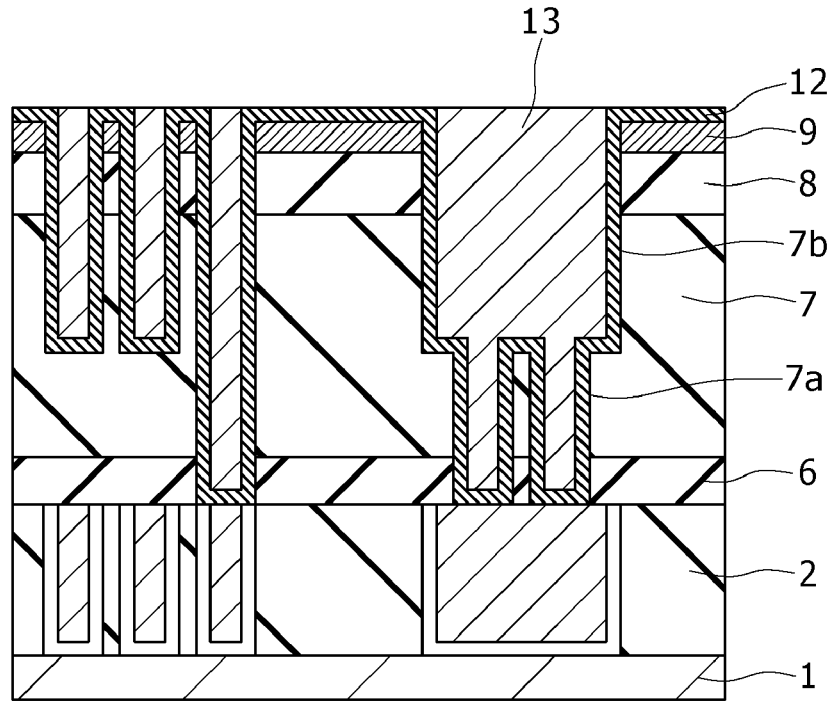

As shown in FIG. 3C, the excessive conductive layer (made of Cu) 13 deposited on a portion other than the contact hole 7a and the wiring trench 7b is removed by utilizing the CMP method for example. In a first step of the CMP method, the excessive conductive layer (made of Cu) 13 is polished by using the silica slurry providing the large selectivity of the excessive conductive layer 13 to each of the barrier metal (Ta) 12 and the insulating film (silicon oxide film) 8. In general, in the conductive layer 13, the swelling amount of pattern is high as the pattern is denser, while the swelling amount of pattern is low as the pattern is sparser (refer to FIG. 3B). For this reason, when the excessive conductive layer 13 made of Cu is polished for all the patterns within the wafer surface, the amount of polishing the barrier metal 12 increases as the pattern is sparser. Thus, it is feared that even when there is used the silica slurry providing the high selectivity of the excessive conductive layer 13 to the barrier metal 12, the overall barrier metal 12 is polished at a stage of the first step. As a result, the uniformity in final wiring height becomes poor. Since the barrier metal 12 comes to be thinned along with scale down of the LSI, this problem becomes more serious. However, in the dual damascene structure formed in accordance with Embodiment 3, the metal mask 9 is deposited as the uppermost layer to be 10 nm thick. Thus, the polishing can be stopped on the metal mask 9 even when the thin barrier metal 12 with 3 nm thickness is formed, which makes it possible to form the wiring which is excellent in flatness.

Figure 3D:
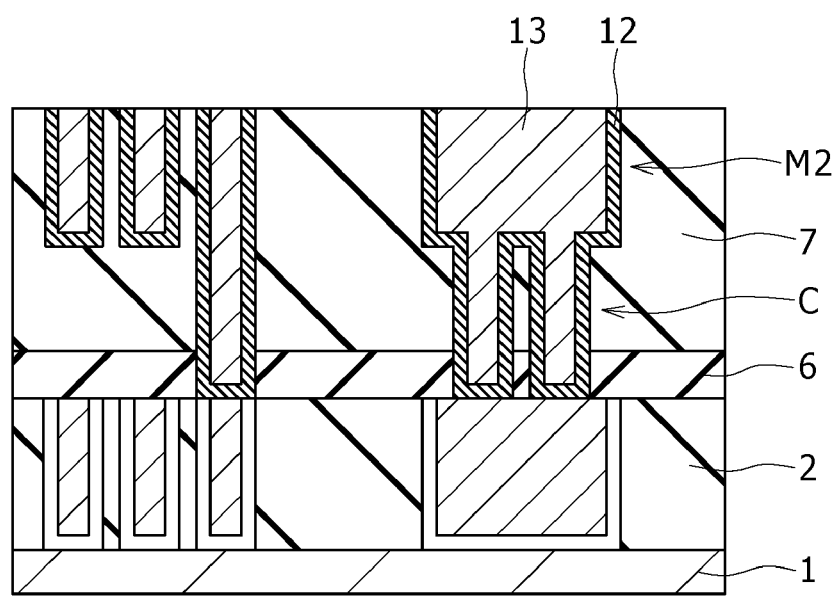
Figure 4A:
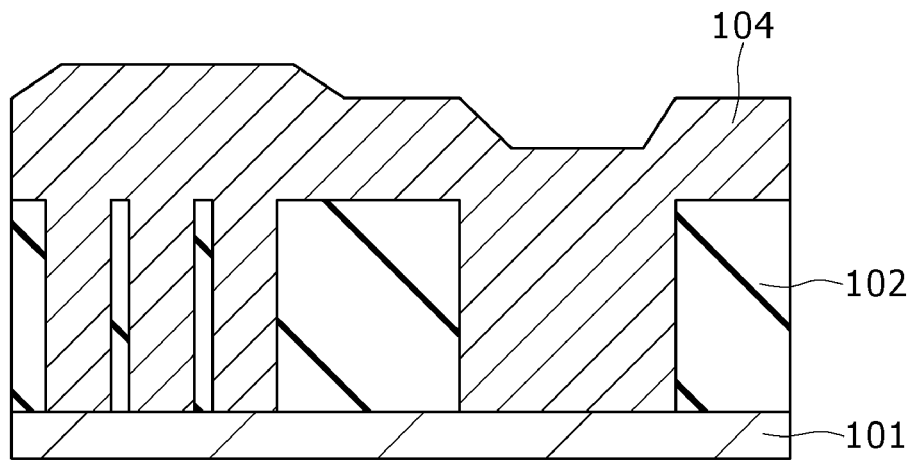
FIGS. 4A to 4C are respectively process cross sectional views explaining a problem in a method of manufacturing a semiconductor device in related art.
Figure 4B:
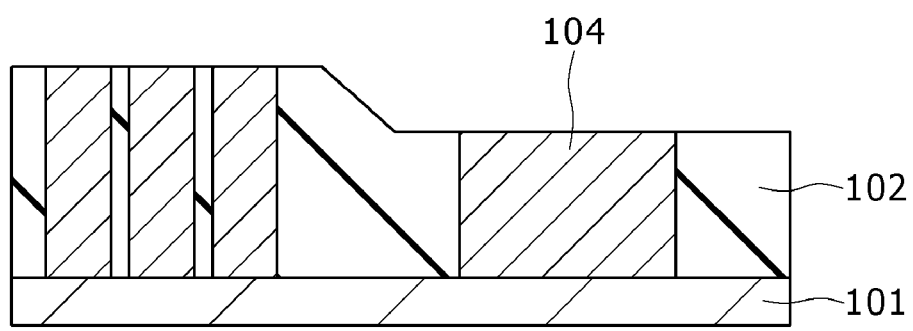
Figure 4C:
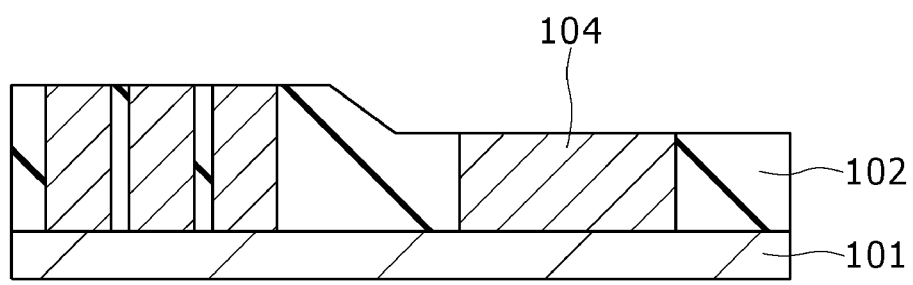
Figure 5A:
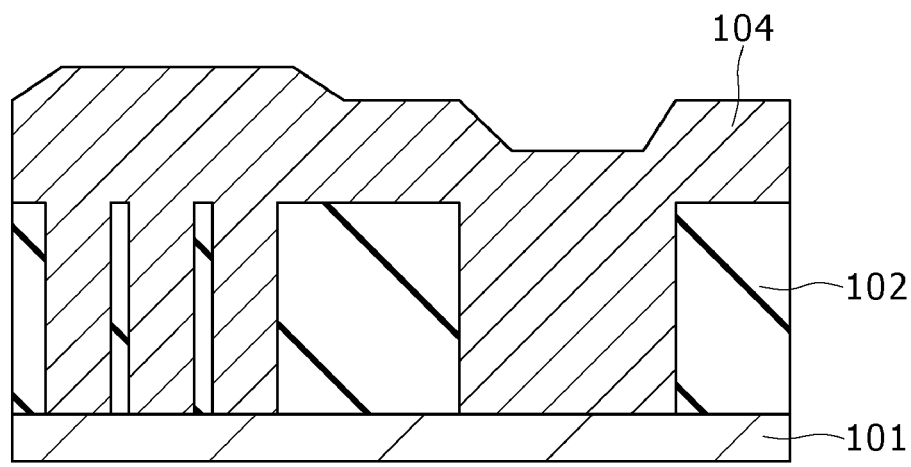
FIGS. 5A to 5C are respectively process cross sectional views explaining another problem in the method of manufacturing a semiconductor device in related art.
Figure 5B:
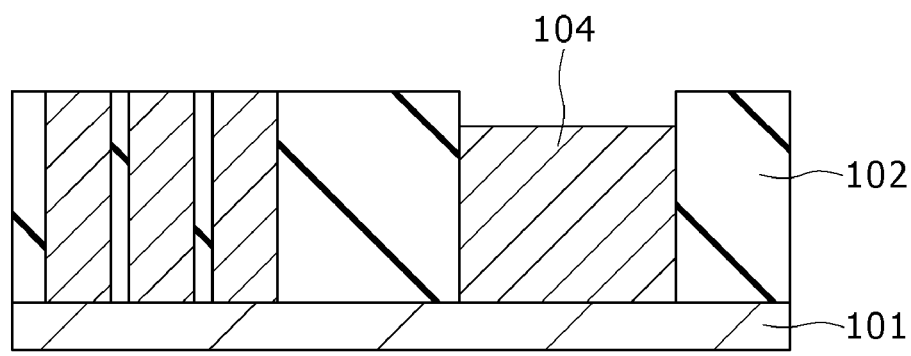
Figure 5C:
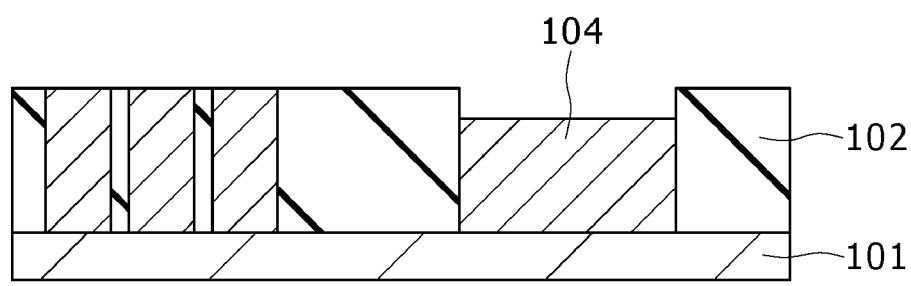

As shown in FIG. 3D, in a second step of the CMP method, the excessive metal mask 9 and the barrier metal 12 on the second interlayer insulating film 7 are polished by using the silica slurry for equalizing all the polishing rates of the barrier metal (Ta) 12, the metal mask 9, the insulating film (silicon oxide film) 8, the second interlayer insulating film (silicon carbide oxide film) 7, and the conductive layer (made of Cu) 13 to one another. Here, although the polishing is excessively performed in order to suppress the polishing residues of the metal mask 9 and the barrier metal 12 (over-polishing), since the silica slurry is used to equalize all the polishing rates of the barrier metal 12, the metal mask 9, the insulating film 8, the second interlayer insulating film 7, and the conductive layer (made of Cu) 13 to one another, the polishing progresses while the flatness obtained in the first step of the CMP method is maintained. As a result, it becomes possible to form the Cu wiring which is free from the polishing residue of the metal mask 9, and thus which is excellent in flatness. At that, the amount of excessive metal mask 9 and barrier metal 12 over-polished in Embodiment 3 is adjusted so that a final height of the second level wiring M2 becomes 130 nm.

In Embodiment 3, it is possible to form the structure which has the thin barrier metal 12 within the contact hole 7a and the wiring trench 7b, and which has the thick metal mask 9 on the portion other than the contact hole 7a and the wiring trench 7b. Hence, while the conductive layer 13 is subjected to the CMP, the polishing can be stopped on the metal mask 9 while the excellent flatness is maintained. Thus, it is possible to suppress the getting worse of the flatness of the wiring. As a result, even when the LSI design rule proceeds to scale down, it is possible to provide the semiconductor device which has the low resistance, i.e., the high processing speed. The semiconductor device manufactured in accordance with Embodiment 3 of the present invention has at least the lower resistance, higher processing speed and less dispersion (more excellent flatness) characteristics than any of the semiconductor device in related art has.

It should be noted that the present invention is not intended to be limited to the descriptions of Embodiments 1 to 3.

Each of the metal masks 3 and 9 is not limited to the kind of film, the film thickness and the manufacturing method described above. That is to say, for example, Pd, Ni, Co, W, Ta, Ti, Ru, Au, Ag, Al, Mn, Mg, Ge, Zr or Cr, an alloy thereof, a nitride thereof, or a multilayer metal film in which a plurality of metal, alloy and nitride are combined with one another may also be applied to each of the metal masks 3 and 9.

In addition, the description has been given so far with respect to Embodiments 1 to 3 in each of which the silicon carbide oxide film is used as the insulating material of which each of the first interlayer insulating film 2 and the second interlayer insulating film 7 is made. However, it is to be understood that in addition to the silicon carbide oxide film, any of the insulating films used in the semiconductor devices can be applied to each of the first interlayer insulating film 2 and the second interlayer insulating film 7. For example, even when a silicon oxide ($SiO_2$) film, an organic film such as a methyl silsesquioxane (MSQ) film or a hydrogen silsesquioxane (HSQ) film which is formed by utilizing a spin coating method, or a polyaryl ether film, a polyarylene ether film, an amorphous carbon film or a polytetrafluoroethylene film, or a porous film which is obtained from any of such films is applied to each of the first interlayer insulating film 2 and the second interlayer insulating film 7, there is no problem.

It is also possible to adopt a so-called hybrid wiring structure in which the interlayer insulating film for formation of the contact hole 7a and the interlayer insulating film for formation of the wiring trench 7b are changed in each of Embodiments 2 and 3. In addition, the method of forming the dual damascene structure which has been described so far in each of Embodiments 2 and 3 is merely an example, and thus the present invention can be applied to all methods of forming the same.

The material of each of the seed layers 4 and 10 described in Embodiments 1 and 2, respectively, is not limited to the kind of film, and the content as described above. That is to say, for example, Pd, Ni, Co, W, Ta, Ti, Ru, Au, Ag, Al, Mn, Mg, Ge, Zr or Cr, an alloy thereof, a nitride thereof, or a material in which a plurality of metal, alloy and nitride are combined with one another may also be applied to each of the seed layers 4 and 10. In addition, even when the content of the metal material is increased as long as this increase allows for the resistance value of the final copper wiring, there is no problem.

Moreover, it should be noted that the various changes may also be made without departing from the gist of the present invention.

While a preferred embodiment of the present invention has been described using specific terms, such description is for illustrative purposes, and it is to be understood that changes and variations may be made without departing from the spirit or scope of the following claims.

What is claimed is:

1. A method of manufacturing a semiconductor device, comprising the steps of:

forming an interlayer insulating film containing Si on a semiconductor substrate;

forming a metal mask on said interlayer insulating film, said metal mask being formed to a thickness of approximately 10 nm;

forming a resist layer on said metal mask having a wiring pattern formed by a lithography technique;

forming a pattern trench in said metal mask and said interlayer insulating film by etching away parts of said metal mask and said interlayer insulating film using the resist mask wiring removing said resist layer through an ashing using $O_2$ plasma;

forming a seed layer containing an alloy of copper and another metal manganese on an internal wall of said pattern trench;

forming a conductive layer containing copper on said interlayer insulating film so as to fill in said pattern trench;

forming a barrier layer for preventing diffusion of copper by causing said seed layer and said interlayer insulating film to react with each other through an annealing treatment; and polishing the conductive layer and said metal mask on said interlayer insulating film to remove excessive Cu or Cu alloy using said metal mask as a polishing stopper so as to leave said conductive layer in said pattern trench, wherein said step of polishing the conductive layer and said metal mask on said interlayer insulating film to remove said excessive Cu or Cu alloy using said metal mask as said polishing stopper comprises:

first polishing step of polishing said conductive layer by using a slurry having a polishing selectivity of said conductive layer to each of said metal mask and said interlayer insulating film; and second polishing step of polishing surfaces of said interlayer insulating film and said conductive layer until at least said metal mask is removed by using a slurry for substantially equalizing polishing rates of said metal mask, said interlayer insulating film, and said conductive layer to one another.

* * * * *